(12) United States Patent
Bennahmias et al.

(10) Patent No.: US 8,409,984 B2
(45) Date of Patent: Apr. 2, 2013

(54) APPARATUS AND METHOD FOR MANUFACTURING MULTI-COMPONENT OXIDE HETEROSTRUCTURES

(75) Inventors: Mark Joseph Bennahmias, Ladera Ranch, CA (US); Michael John Zani, Laguna Niguel, CA (US); Jeffrey Winfield Scott, Santa Barbara, CA (US)

(73) Assignee: NexGen Semi Holding, Inc., Laguna Niguel, CA (US)

( * ) Notice: Subject to any disclaimer, the term of this patent is extended or adjusted under 35 U.S.C. 154(b) by 417 days.

(21) Appl. No.: 12/813,394

(22) Filed: Jun. 10, 2010

(65) Prior Publication Data
US 2011/0065237 A1 Mar. 17, 2011

Related U.S. Application Data

(60) Provisional application No. 61/185,957, filed on Jun. 10, 2009.

(51) Int. Cl.
*H01L 21/00* (2006.01)
(52) U.S. Cl. ............... 438/643; 438/689; 257/E21.274; 257/E27.062; 257/E29.255; 257/E29.343
(58) Field of Classification Search ............ 438/643, 438/689–720; 257/E21.274, 27.062, 29.255, 257/309, 343
See application file for complete search history.

(56) References Cited

U.S. PATENT DOCUMENTS

| | | | |
|---|---|---|---|
| 7,045,430 B2 * | 5/2006 | Ahn et al. | 438/287 |
| 7,259,373 B2 | 8/2007 | Zani et al. | |
| 2005/0271813 A1 * | 12/2005 | Kher et al. | 427/248.1 |
| 2006/0046522 A1 | 3/2006 | Ahn et al. | |
| 2007/0098892 A1 * | 5/2007 | Chung et al. | 427/248.1 |
| 2008/0160431 A1 | 7/2008 | Scott et al. | |
| 2010/0227758 A1 * | 9/2010 | Yang et al. | 502/303 |
| 2011/0037117 A1 * | 2/2011 | Ahn et al. | 257/324 |

FOREIGN PATENT DOCUMENTS

WO WO 2010/144730 12/2010

OTHER PUBLICATIONS

International Search Report and Written Opinion in PCT/US2010/038211 dated Dec. 14, 2010 in 14 pages.

* cited by examiner

*Primary Examiner* — Michael Lebentritt
(74) *Attorney, Agent, or Firm* — Knobbe, Martens, Olson & Bear, LLP

(57) ABSTRACT

Certain embodiments disclosed herein relate to the formation of multi-component oxide heterostructures (MCOH) using surface nucleation to pattern the atomic layer deposition (ALD) of perovskite material followed by patterned etch and metallization to produce ultra-high density MCOH nanoelectronic devices. Applications include ultra-high density MCOH memory and logic, as well as electronic functionality based on single electrons, for example a novel flash memory cell Floating-Gate (FG) transistor with $LaAlO_3$ as a gate tunneling dielectric. Other types of memory devices (DIMMS, DRAM, and DDR) made with patterned ALD of $LaAlO_3$ as a gate dielectric are also possible.

31 Claims, 12 Drawing Sheets

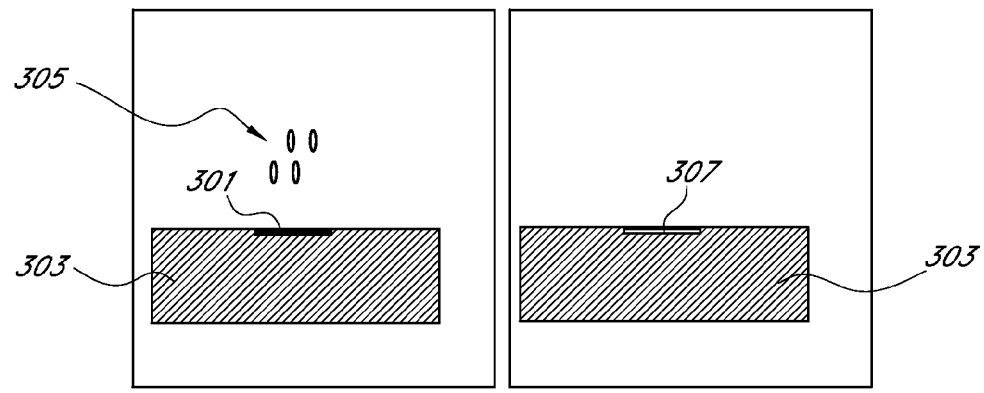
*FIG. 3A*  *FIG. 3B*
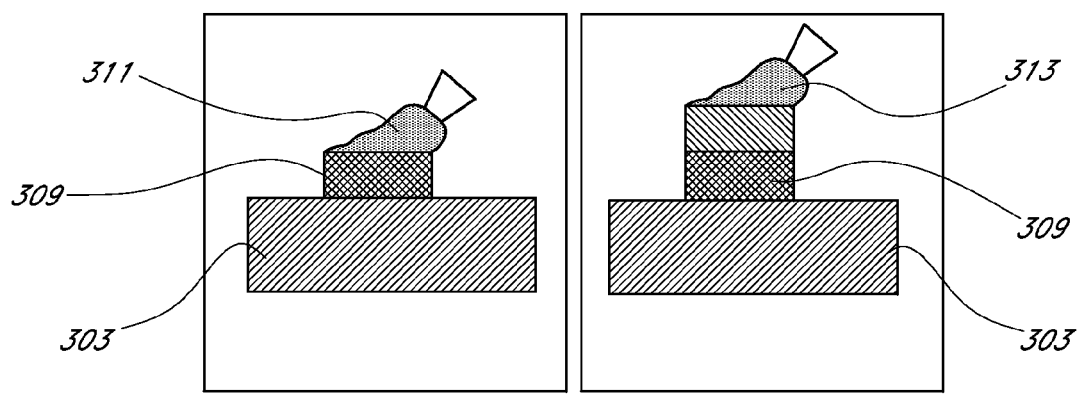
*FIG. 3C*  *FIG. 3D*

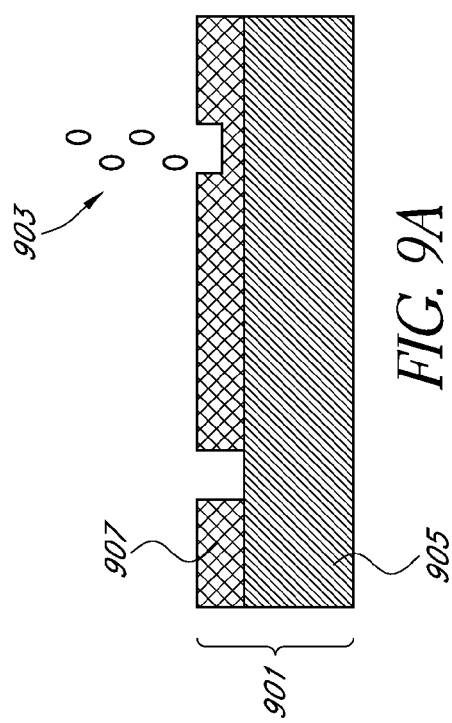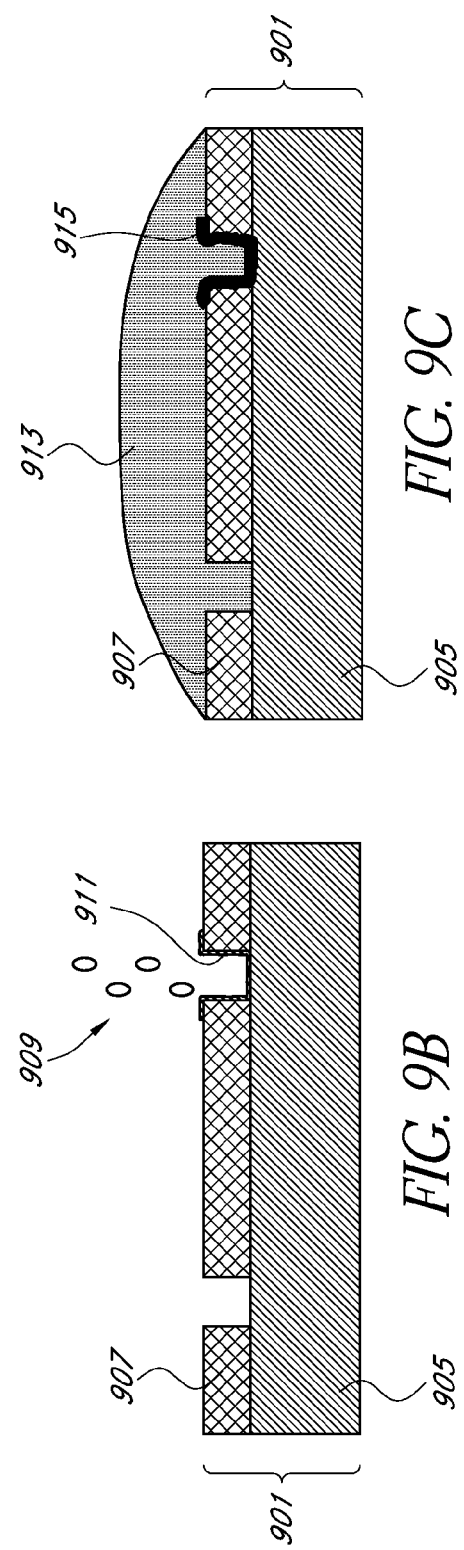

APPARATUS AND METHOD FOR MANUFACTURING MULTI-COMPONENT OXIDE HETEROSTRUCTURES

CROSS-REFERENCE TO RELATED APPLICATIONS

This application claims priority under 35 U.S.C. §119(e) to U.S. Provisional Application Ser. No. 61/185,957, filed Jun. 10, 2009, entitled "APPARATUS AND METHOD FOR MANUFACTURING MULTI-COMPONENT OXIDE HETEROSTRUCTURES," which is incorporated herein by reference in its entirety.

STATEMENT REGARDING FEDERALLY SPONSORED R&D

This invention was made with Government support under contract FA9550-09-C-0199 SBIR Phase I awarded by the U.S. Air Force. The Government has certain rights in the invention.

BACKGROUND OF THE INVENTION

1. Field of the Invention

This application relates generally to semiconductor devices and patterned device fabrication. More particularly, this application relates to the formation of multi-component oxide heterostructures (MCOH) using patterned atomic layer deposition (ALD) and patterned etch and metallization to produce ultra-high density MCOH nano-electronic devices.

2. Description of the Related Art

A high-mobility two-dimensional electron gas (2DEG) at the interface between a polar oxide (e.g., $LaAlO_3$) and a non-polar oxide (e.g., $SrTiO_3$) has fueled significant interest in oxide-based electronics. The interface between these materials can be switchable between a metallic and insulating state when the $LaAlO_3$ thickness is exactly 3 unit cells. Some suggest this occurs due to charge interactions between the different layers. In $LaAlO_3$, the valences of the LaO layer carry a net charge of +e and the $AlO_2$ layer carries a net charge of −e, resulting in a neutral unit cell. In contrast, the individual layers in $SrTiO_3$ are charge neutral. When a $LaO^+$ layer is joined to a $TiO_2^0$ neutral layer, a polar discontinuity occurs that can cause charge rearrangement where conceptually half an electron is transferred from the LaO layer to the $TiO_2$ layer. Since the AO—$BO_2$ stacking sequence is maintained in perovskite heterostructures along the [001] direction, a polarity discontinuity arises at the $LaAlO_3$—$SrTiO_3$ interface. Because the titanium (Ti) ion allows for mixed valence charge compensation, this results in the net transfer of electrons (nominally 0.5 electron per two-dimensional unit cell) from $LaAlO_3$ to $SrTiO_3$ across the interface. Other evidence suggests that vacancies created in the substrate during growth are responsible for the transport properties observed; however, a sole vacancy model does not explain the strikingly high mobility observed. In certain circumstances, the values can be as high as $n_e = 10^{14} cm^{-2}$ and $\mu = 10^4 cm^2 V^{-1} s^{-1}$. It may also be possible that both vacancies and polar discontinuities are responsible for these observations. In any case, such interfacial conductance in MCOH can be patterned for a small number of devices at scales approaching one nanometer using a conducting atomic-force microscope (AFM) probe.

SUMMARY OF THE INVENTION

In certain embodiments, a method of forming an array of multi-component oxide heterostructures includes exposing a substrate comprising a $SrTiO_3$ top layer to a digital beam in a first chamber comprising a focused ion beam to introduce site specific surface nucleation and to generate a density of oxygen vacancies. The method can include moving the exposed substrate into a second chamber to induce thermal activation of said substrate, moving the thermally activated substrate into a third chamber, introducing a lanthanum containing precursor into the third chamber, and introducing an aluminum containing precursor into the third chamber. Furthermore, the method can include controlling the introducing of the lanthanum containing precursor and the introducing of the aluminum containing precursor to form by patterned atomic layer deposition a dielectric layer comprising $LaAlO_3$ having a thickness of 2 to 4 unit cells to form a well-defined high density array of multi-component oxide heterostructures. In some embodiments, after introducing the lanthanum containing precursor into the third chamber, a first oxygen containing precursor can be introduced into the third chamber. In addition, after introducing the aluminum containing precursor into the third chamber, a second oxygen containing precursor can be introduced into the third chamber. After each precursor is introduced, the third chamber can be purged with a purging gas. The introducing of the lanthanum containing precursor and the aluminum containing precursor can be repeated for a number of cycles to achieve a desired thickness of unit cells.

In certain embodiments, a method of processing to deposit a material onto a workpiece includes directing a digital beam comprising charged particles onto the workpiece in a pattern in a first chamber, transferring the workpiece to a second chamber, and applying a reactant gas to deposit material onto the area exposed by the digital beam on the workpiece surface. In some embodiments, a method of depositing a material onto a workpiece includes directing a beam comprising charged particles onto a surface of the workpiece in a pattern in a first chamber to chemically modify portions of the surface, transferring the workpiece to a second chamber, and applying a reactant to the workpiece wherein the reactant reacts with the chemically modified portions to cause material deposition.

In certain embodiments, a method of forming a multi-component oxide heterostructure includes introducing a lanthanum containing precursor into a chamber, introducing an aluminum containing precursor into the chamber, and forming a layer comprising $LaAlO_3$. The method can further include controlling the introducing of the lanthanum containing precursor and the introducing of the aluminum containing precursor to form the layer comprising $LaAlO_3$ with a thickness of 2 to 4 unit cells to form a well-defined high density array of multi-component oxide heterostructures. For example, the thickness of layer comprising $LaAlO_3$ can be 3 unit cells.

In certain embodiments, a method of forming a multi-component oxide heterostructure includes forming nucleation sites on a $SrTiO_3$ surface of a substrate with a focused ion beam by chemically modifying portions of the surface of the substrate, and depositing at least one layer of $LaAlO_3$ at the nucleation sites. The method can further include thermally activating the substrate after forming the nucleation sites. The depositing the at least one layer can include reacting a gas with the nucleation sites. The reacting a gas with the nucleation sites can include multi-nucleation activation deposition. The depositing the at least one layer can include exposing the substrate to a precursor comprising lanthanum. The depositing the at least one layer further comprises exposing the substrate to a precursor comprising aluminum. The depositing the at least one layer can also include exposing the substrate to a first precursor comprising oxygen. The depositing the at least one layer can further include exposing the substrate to a second precursor comprising oxygen. Exposing the substrate to the precursor comprising lanthanum, the first precursor comprising oxygen, the precursor comprising aluminum and the second precursor comprising oxygen is repeated to achieve a thickness of the at least one layer.

In certain embodiments, the focused ion beam is a digital beam. The digital beam can include forming a stream of particles, collimating the stream of particles along an axis of propagation to form the focused ion beam, and digitizing the focused ion beam. The digitizing the focused ion beam can include creating temporally and spatially resolved digital flashes comprising at least one particle per digital flash. The method can further include deflecting the digital beam with a series of deflectors disposed longitudinally along an axis of the digital beam.

In certain embodiments, a method of forming an array of multi-component oxide heterostructures includes depositing a conformal mask layer on a substrate comprising a $SrTiO_3$ top layer, and etching the conformal mask layer to form a conformal mask exposing selected areas of the $SrTiO_3$ top layer. The method can further include exposing the substrate to a digital beam in a first chamber. The digital bean can include a focused ion beam to introduce site specific surface nucleation and to generate a density of oxygen vacancies. The method can further include moving the exposed wafer into a second chamber to induce thermal activation of said site surface nucleation, and moving the thermally activated substrate into a third chamber. The method includes introducing a lanthanum containing source gas into the third chamber containing said thermally activated substrate, introducing a first oxygen containing source gas into the third chamber containing said thermally activated substrate, introducing an aluminum containing source gas into the third chamber containing said thermally activated substrate, and introducing a second oxygen containing source gas into the third chamber containing said thermally activated substrate. Furthermore, the method can include controlling the introducing of the lanthanum containing precursor and the introducing of the aluminum containing precursor to form by patterned atomic layer deposition a dielectric layer comprising $LaAlO_3$ having a thickness of 2 to 4 unit cells to form a well-defined multi-component oxide heterostructure.

In certain embodiments, a method for producing patterns includes using a conformal mask for focused ion beam patterning. In some embodiments, the mask comprises three layers including an organic process mask layer, an etch mask layer, and the FIB mask layer. In further embodiments, the etch mask layer comprises titanium and/or silicon. For example, the etch mask layer can comprise elements selected from the group consisting of titanium and silicon. Certain embodiments of the mask comprise 5 layers including an organic process mask layer, a plating base layer, a second organic layer, an etch mask layer, and the FIB mask layer, wherein the plating base layer usable to image reverse via electroplating to produce a metal mask in the region of FIB exposure.

In certain embodiments, a method of forming an array of multi-component oxide heterostructures includes exposing a substrate comprising a $LaAlO_3$ top layer to a digital beam in a first chamber comprising a focused ion beam to introduce site specific surface nucleation, moving the exposed substrate into a second chamber to induce thermal activation of said substrate, and moving the thermally activated substrate into a third chamber. The method can further include introducing a lanthanum containing precursor into the third chamber, introducing a vanadium containing precursor into the third chamber, introducing a second lanthanum precursor into the third chamber, and introducing an aluminum precursor into the third chamber. The method also includes controlling the introducing of the lanthanum containing precursor and the introducing of the vanadium containing precursor to form by patterned atomic layer deposition a dielectric layer comprising $LaVO_3$ having a dielectric layer thickness of 5 to 20 unit cells to form a well-defined high density array of multi-component oxide heterostructures, and controlling the introducing of the second lanthanum containing precursor and the introducing of the aluminum containing precursor to form by patterned atomic layer deposition a thin dielectric capping layer comprising $LaAlO_3$ having a capping layer thickness of 2 to 4.5 unit cells.

In some embodiments, the method includes forming a PMOS device comprising at least one of the multi-component oxide heterostructures, forming a NMOS device comprising at least one of the multi-component oxide heterostructures, wherein the PMOS device neighbors the NMOS device and the PMOS device is electrically isolated from the NMOS device by at least one electrical isolation barrier. In further embodiments, forming the NMOS device and forming the PMOS device comprise pattern etching the capping layer and the dielectric layer with a digital beam to form sites for ohmic contacts, exposing the sites for ohmic contacts to a digital beam to introduce ohmic contact surface nucleation sites, and depositing an electrical conductor onto the ohmic contact surface nucleation sites.

BRIEF DESCRIPTION OF THE DRAWINGS

FIGS. 3A-D are schematic diagrams of an example embodiment of a process for patterned ALD growth of $LaAlO_3$ onto $SrTiO_3$ substrate to form an array of MCOH.

FIG. 9A-C is a schematic diagram of an example embodiment of a patterned metallization process for MCOH material to edit and trim device structures and to form ohmic contacts.

DETAILED DESCRIPTION

Figure 1B:
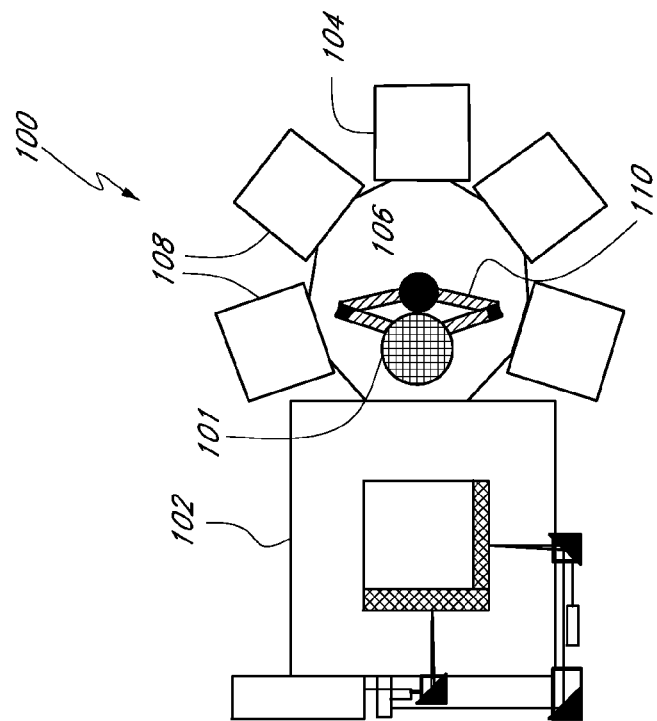
FIG. 1B is a top schematic view of the apparatus of FIG. 1A.
Figure 1A:
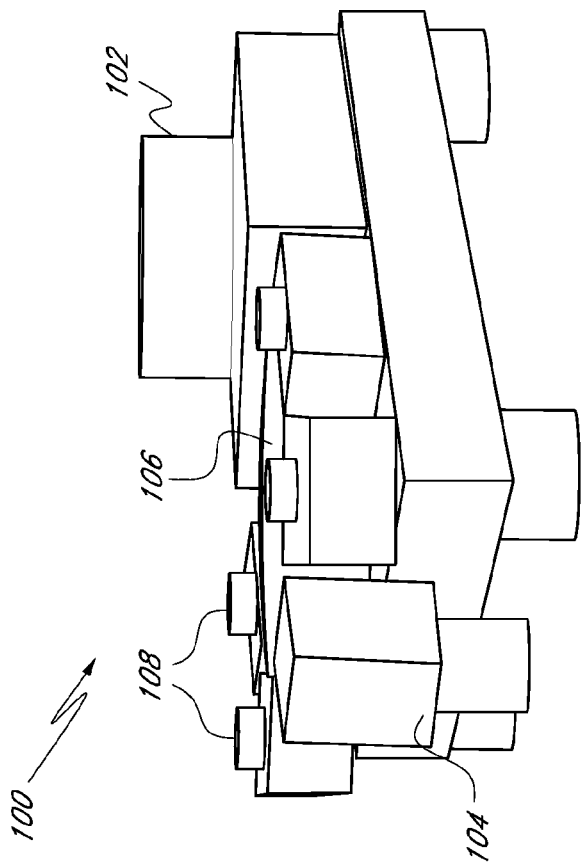
FIG. 1A is a perspective view of an example embodiment of a cluster tool to process ultra-high density of MCOH nanoelectronic devices.

Microelectronics can be manufactured by the deposition, removal (e.g., etching), patterning (e.g., lithography), and/or alteration (e.g., implant) of material on a substrate surface to create the physical properties of a device. As the scale of devices shrinks, lithography becomes the main cost, performance, and throughput bottleneck in the fabrication process. Co-owned U.S. Pat. No. 7,259,373 to Zani et al., incorporated herein by reference in its entirety, discloses a lithography-less process tool that can directly provide nano-scale pattern deposits and etch at high speed and in a cost effective manner onto suitable substrates. For example, FIG. 1A is a perspective view of an example apparatus 100 in accordance with certain embodiments disclosed herein. FIG. 1B is a top schematic view of the apparatus 100 of FIG. 1A. The apparatus 100 comprises an exposure chamber 102, a load lock chamber 104, a transport module 106, and a plurality of processing chambers 108. Although not illustrated, it will be understood that the apparatus 100 comprises a gas manifold system and an automated process controller. Further details regarding the apparatus 100 are described in more detail in U.S. Pat. No. 7,259,373.

Resistless, maskless patterned processing uses the deposition, removal, and implantation of semiconductor-grade materials in lithographically delineated arrays on the wafer. This concept may use a combined advanced processing and production lithography knowledge to consider a solution for any node technology. To this end, Digital Beam Processing (DBP) is an improved version of the older resistless, maskless, patterned processing technique that can be performed on all layers of semiconductor manufacturing within a single cluster tool. In some embodiments, DBP can be based on high speed blanking and deflection of a Focused Ion Beam (FIB) applied with a "multi-activation," chemically and/or physically assisted etch, deposition, and implantation process performed in parallel (outside the exposure chamber).

The ability to deliver appropriate doses (and dose rate per unit pixel) pattern ultra-high density devices on wafer substrates in a cost-efficient manner has proven difficult, for example due to deflection of slow moving ions in a focused continuous beam column.

Figure 2:
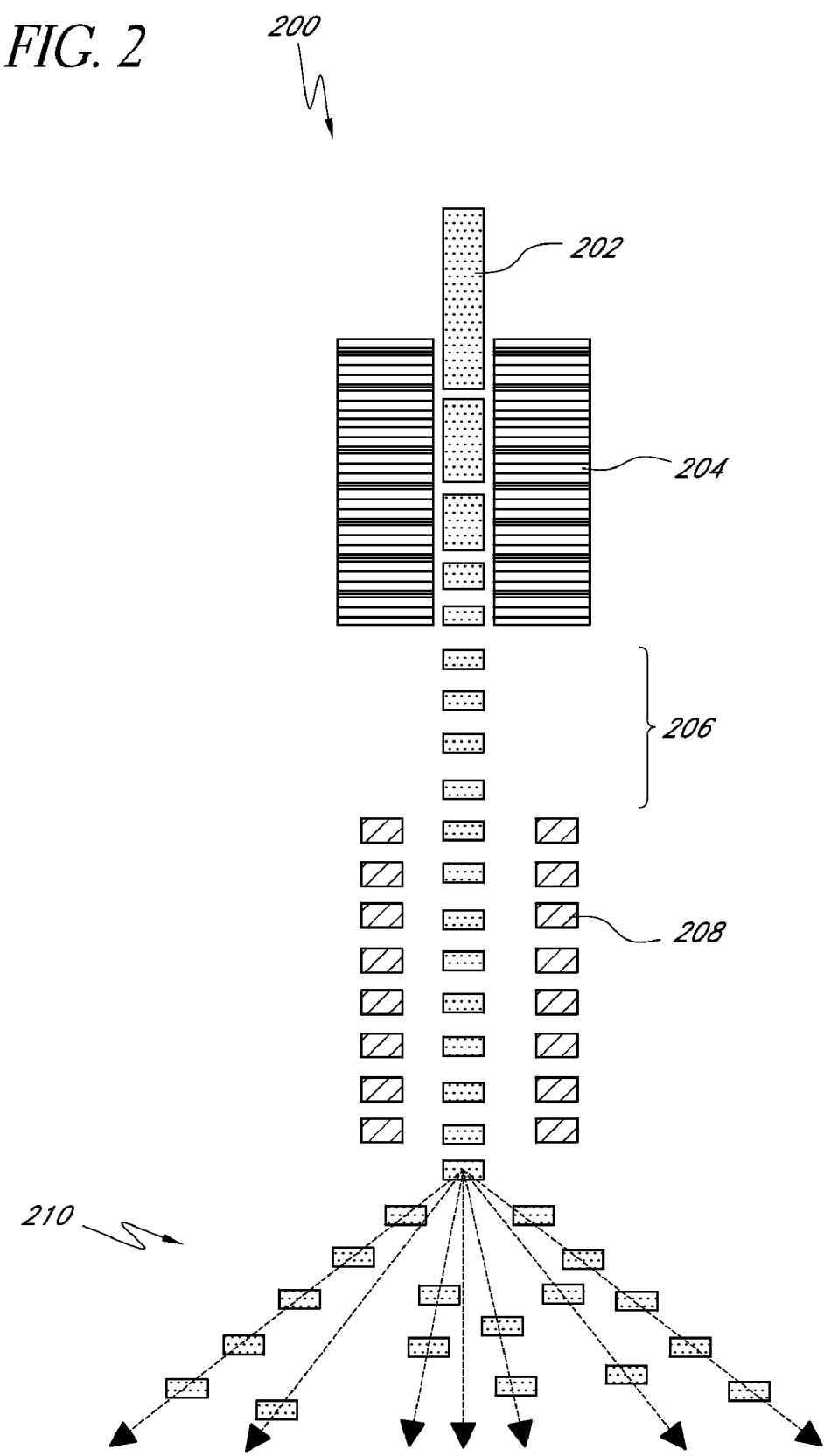
FIG. 2 is a schematic diagram of an example embodiment of a work chamber that can create digital flashes for DBP.

DBP is a viable solution that can provide new lithographic writing strategies such as, for example, raster, vector, and/or vector-raster to fabricate geometric patterns using a bunched ion beam. FIG. 2 is a schematic diagram of an example embodiment of a work chamber 200 that can create digital flashes for DBP. The working chamber 200 can include a ion beam 202 that passes through a beam digitizer 204 (e.g., beam buncher) to create a digital beam comprising discrete groups of at least one charged particle by adjusting the longitudinal spacing between charged particles along the axis of propagation. The work chamber 200 can also include a deflector 208 downstream of the beam digitizer 204. The deflector 208 can deflect individual groups of charged particles in the digital beam to create a temporal distributed pattern 210. Further details regarding the work chamber 200 are described in more detail in U.S. Pat. No. 7,259,373. Generating a steady stream of temporally spaced charge packets can allow additional degrees of freedom that can create the effect of a high speed, digital (on/off or pulsed) writing beam, herein referred to as "digital flashes". In column operation, beam blanking can be synchronized with the leading/trailing edge of deflection to create sharp transitions between beam locations. Applying this "digital flash" to the wafer surface, then applying (e.g., immediately applying) a multi-activation process can allow resistless, maskless patterned processing: deposition, etching, or implantation of material to the surface of a wafer.

Some examples of unique features that can be achieved with application of a digital beam include:

1. Creation of a wave of time dependent high-density particle nodes and low-density (or no density) anti-nodes;
2. Capability to time synchronize a distributed deflection system with the rate at which charge pulses in the beam are produced. Some exemplary techniques known as traveling wave deflecting electrodes can be used. As the particles pass through the deflection system, a high frequency variation in the deflection plate voltage can cause the output beam to change position, but only affecting a single synchronized digital flash; and
3. Capability for timing the changes in voltages in phase with the "nodes" or leading edge of the "dead zone," thereby allowing a sharp leading and following edge of the exposed ion bunches.

Exploitation of some or all of these digital beam attributes can allow for providing an increased exposure dose per unit time at the target. Each effect, alone and/or in combination with one or both of the other effects, is an improvement over existing techniques. Additionally, using all three effects together can provide a vast quality improvement in the particle beam velocity that is, for example, more uniform and has less optical aberration. In some embodiments, the pulse density can be almost twice the original density due to bunching. The beam blanking and deflection can be performed during the dead zone of the pulse, improving the rising edge ringing, and following edge tail effects of the beam. Ions that would have exposed the wafer during the blanking/deflection can be grouped into pre- or post-packets, doubling the effective write time on the wafer target. The overall average dose vs. deflection per unit time can provide a digitally controlled moving beam of uniformly pulsed, high current density particles with negligible blanking and deflection overhead.

FIG. 3A illustrates an example embodiment in which patterned nucleation sites 301 are directly written onto the surface of an electrically insulating SrTiO$_3$ (STO) wafer 303 to promote surface energetics for preferential heterogeneous growth of the MCOH material at the nucleated sites 301 and to induce sufficient oxygen vacancies at these surface sites on the STO wafer (e.g., SrTiO$_{3-\delta}$) by applying well placed low energy ions 305 with high resolution, low energy, and dose. The exposed wafer 303 is then transferred to a second chamber for thermal activation of these patterned nucleated surface sites. FIG. 3B illustrates an example embodiment in which the patterned nucleation sites 301 are thermally activated to form thermally activated nucleated sites 307. The wafer is then inserted into an atomic layer deposition (ALD) system. FIG. 3C illustrates an example embodiment in which by a proper selection of the surface thermolysis reactions, the ALD system preferentially deposits monolayer coverage of oxides 309 at the thermally activated nucleation sites 307 by exposure of the wafer surface to first a precursor gas (not illustrated) that absorbs on the surface and then exposure to a reactive gas 311 that combines with the absorbed precursor to produce a monolayer of oxide 309. By repeated exposure to the two gas cycles, oxide layers 309 of specific number of unit cells can be grown with monolayer control and excellent conformal coverage. Each of the above processes may be performed in the same chamber or in different chambers. For example, after nucleation sites 301 are patterned, the wafer 303 may not be transferred to a second chamber for thermal activation and thermal activation can be performed in the same chamber as patterning the nucleation sites 301.

In some embodiments, nucleation sites 301 are formed on the surface of the substrate 303 with a focused beam of charged particles (e.g., focused ion beam). The ions chemically modify portions of the surface of the substrate 303. The chemical modification of the surface can be the production of oxygen vacancies. In addition, the focused ion beam can be a digital beam. The substrate can be resistless during exposure of the focused ion beam. Embodiments include dosages of the digital beam of less than about $5 \times 10^{17}$ charged particles/cm$^2$, less than about $5 \times 10^{16}$ charged particles/cm$^2$, less than about $5 \times 10^{15}$ charged particles/cm$^2$, less than about $5 \times 10^{14}$ charged particles/cm$^2$, less than about $5 \times 10^{13}$ charged particles/cm$^2$, less than about $5 \times 10^{12}$ charged particles/cm$^2$, less than about $5 \times 10^{11}$ charged particles/cm$^2$, and less than about $5 \times 10^{10}$ charged particles/cm$^2$. Other dosages are also possible.

The digital beam can include creating temporally and spatially resolved digital flashes that include at least one particle per digital flash. The digital beam can be deflected by using a series of deflection stages disposed longitudinally along an axis of propagation of the ion beam. The digital beam can also be de-magnified.

The precursor gas or reactant gas causes nucleation and material growth in the areas of the substrate or workpiece exposed to the focused ion beam. The reactant gas can cause multi-nucleation activation deposition. The reactant gas in some embodiments includes a plurality of precursor gases. The substrate temperature can also be increased during the application of the reactant gas. Furthermore, different separate substrate temperatures can be selected for each precursor.

In some embodiments, a first precursor includes lanthanum (La). The lanthanum from the precursor is absorbed at the nucleation sites created by the focused ion beam. A first oxygen (O) containing precursor can react with the absorbed lanthanum precursor to form a lanthanum oxide (LaO) layer. FIG. 3D illustrates an example embodiment in which an aluminum oxide (AlO) layer 313 is deposited onto the LaO layer 309. In some embodiments, a second precursor includes aluminum (Al). The aluminum from the precursor is absorbed to the LaO layer 309. A second oxygen containing precursor can react with the absorbed aluminum to form an AlO layer 313. The reaction chamber can be purged between each precursor with a purging gas.

Figure 4A:
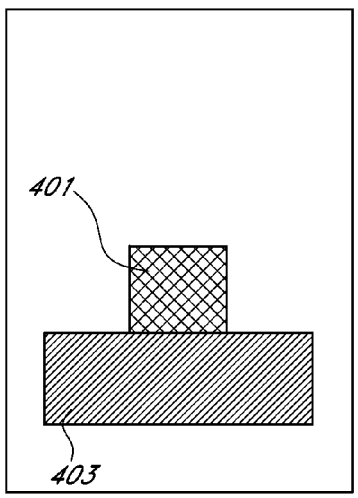
FIGS. 4A-C are schematic diagrams of an example embodiment of a process for patterned ALD growth of a multiple unit cell $LaAlO_3$ layer onto a $SrTiO_3$ substrate to form an array of MCOH.
Figure 4B:
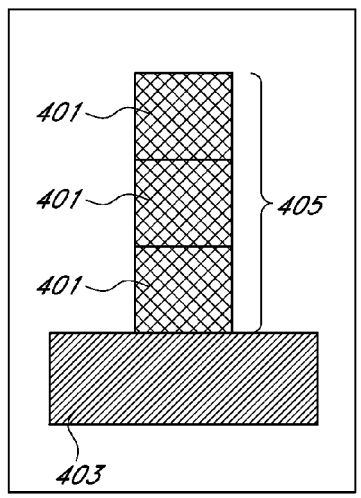
Figure 4C:
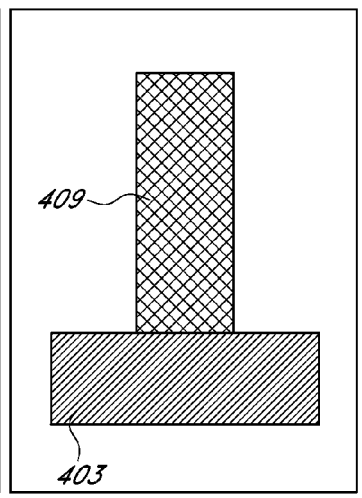

FIGS. 4A-C are a schematic diagram of an example embodiment of a process for patterned ALD growth of a multiple unit cell LaAlO$_3$ layer 409 onto a SrTiO$_3$ substrate 403 to form an array of MCOH. In certain embodiments, the first precursor includes aluminum and the second precursor includes lanthanum to form a LaAlO$_3$ unit cell 401, as illustrated in FIG. 4A. The substrate is maintained at a selected temperature for each introducing of a precursor, and the selected temperature is set independently for each precursor. The introducing of precursors can be repeated for a number of cycles to achieve a desired thickness. For example, a lanthanum containing precursor, a first oxygen containing precursor, an aluminum containing precursor, and a second oxygen containing precursor can be each pulsed in sequence to form a dielectric layer of LaAlO$_3$ with a layer thickness of a single unit cell. The sequence can be repeated to form a layer of LaAlO$_3$ with multiple unit cells. For example, a layer of LaAlO$_3$ with a thickness of 2 to 4 unit cells can be formed into a well-defined high density array of multi-component oxide heterostructures. FIG. 4B illustrates an example embodiment of a layer of LaAlO$_3$ 405 that includes three unit cells 401. In some embodiments, the dielectric layer of LaAlO$_3$ has a thickness of 3 unit cells. In addition, the dielectric layer of LaAlO$_3$ can be annealed. FIG. 4C illustrates an example embodiment of a three unit cell layer of LaAlO$_3$ 409 that has been annealed. The annealing temperature can be in the range of about 800° C. to about 900° C. FIGS. 4A-C illustrate an example embodiment of process for growing a three unit cell layer of LaAlO$_3$ on a SrTiO$_3$ substrate. However, other structures can be grown.

In certain embodiments, a method of forming an array of multi-component oxide heterostructures includes exposing a substrate comprising a SrTiO$_3$ top layer to a digital beam in a first chamber comprising a focused ion beam to introduce site specific surface nucleation and to generate a density of oxygen vacancies. The method can include moving the exposed substrate into a second chamber to induce thermal activation of said substrate, moving the thermally activated substrate into a third chamber, introducing a lanthanum containing precursor into the third chamber, and introducing an aluminum containing precursor into the third chamber. Furthermore, the method can include controlling the introducing of the lanthanum containing precursor and the introducing of the aluminum containing precursor to form by patterned atomic layer deposition a dielectric layer comprising LaAlO$_3$ having a thickness of 2 to 4 unit cells to form a well-defined high density array of multi-component oxide heterostructures. In some embodiments, after introducing the lanthanum containing precursor into the third chamber, a first oxygen containing precursor can be introduced into the third chamber. In addition, after introducing the aluminum containing precursor into the third chamber, a second oxygen containing precursor can be introduced into the third chamber. After each precursor is introduced, the third chamber can be purged with a purging gas. The introducing of the lanthanum containing precursor and the aluminum containing precursor can be repeated for a number of cycles to achieve a desired thickness of unit cells.

In certain embodiments, a method of depositing a material on a workpiece includes forming a beam comprising particles, directing the beam towards areas of the workpiece in a pattern in an exposure chamber, and applying a reactant gas to the workpiece, the reactant gas reacting with the areas of the workpiece to deposit the material. The beam can include a digital beam. Some embodiments include, transferring the workpiece to a second chamber before applying the reactant gas. In one embodiment, the workpiece is resistless while directing the digital beam.

Applying the reactant gas can include causing a multi-nucleation activation deposition process of material growth in the areas exposed to the digital beam of the workpiece. Applying the reactant gas can also include introducing a plurality of precursor gases. Applying the reactant gas can include causing a multi-atomic layer deposition of material growth in the areas. The method can also include increasing temperature while applying the reactant gas. In certain embodiments, forming the digital beam includes forming a stream of the particles, collimating the stream along an axis of propagation, and digitizing the stream.

Forming the digital beam can include creating temporally and spatially resolved digital flashes comprising at least one particle per digital flash. In certain embodiments, directing the digital beam includes deflecting the digital beam using a series of deflection stages disposed longitudinally along an axis of propagation of the beam, and demagnifying the digital beam. Some embodiments include a workpiece manufactured by any of the described methods herein.

In certain other embodiments, a method of depositing a material onto a workpiece includes forming a beam comprising particles, directing the beam towards a surface of the workpiece in a pattern in a chamber, the particles chemically modifying portions of the surface, and applying a reactant to the workpiece wherein the reactant reacts with the chemically modified portions to cause material deposition.

In certain embodiments, a method of processing to deposit a material onto a workpiece includes directing a digital beam comprising charged particles onto the workpiece in a pattern in a first chamber, transferring the workpiece to a second chamber, and applying a reactant gas to deposit material onto the area exposed by the digital beam on the workpiece surface. In some embodiments, a method of depositing a material onto a workpiece includes directing a beam comprising charged particles onto a surface of the workpiece in a pattern in a first chamber to chemically modify portions of the surface, transferring the workpiece to a second chamber, and applying a reactant to the workpiece wherein the reactant reacts with the chemically modified portions to cause material deposition.

In certain embodiments, a method of forming a multi-component oxide heterostructure includes introducing a lanthanum containing precursor into a chamber, introducing an aluminum containing precursor into the chamber, and forming a layer comprising $LaAlO_3$. The method can further include controlling the introducing of the lanthanum containing precursor and the introducing of the aluminum containing precursor to form the layer comprising $LaAlO_3$ with a thickness of 2 to 4 unit cells to form a well-defined high density array of multi-component oxide heterostructures. For example, the thickness of layer comprising $LaAlO_3$ can be 3 unit cells.

In certain embodiments, a method of forming a multi-component oxide heterostructure includes forming nucleation sites on a $SrTiO_3$ surface of a substrate with a focused ion beam by chemically modifying portions of the surface of the substrate, and depositing at least one layer of $LaAlO_3$ at the nucleation sites. The depositing at least one layer can include atomic layer deposition. The method can further include thermally activating the substrate after forming the nucleation sites. The depositing the at least one layer can include reacting a gas with the nucleation sites. The reacting a gas with the nucleation sites can include multi-nucleation activation deposition. The depositing the at least one layer can include exposing the substrate to a precursor comprising lanthanum. The depositing the at least one layer further comprises exposing the substrate to a precursor comprising aluminum. The depositing the at least one layer can also include exposing the substrate to a first precursor comprising oxygen. The depositing the at least one layer can further include exposing the substrate to a second precursor comprising oxygen. Exposing the substrate to the precursor comprising lanthanum, the first precursor comprising oxygen, the precursor comprising aluminum and the second precursor comprising oxygen is repeated to achieve a thickness of the at least one layer. In some embodiments, a source of the oxygen can be selected from the group consisting of ozone, oxygen and distilled water vapor.

In certain embodiments, the focused ion beam is a digital beam. The digital beam can include forming a stream of particles, collimating the stream of particles along an axis of propagation to form the focused ion beam, and digitizing the focused ion beam. The digitizing the focused ion beam can include creating temporally and spatially resolved digital flashes comprising at least one particle per digital flash. The method can further include deflecting the digital beam with a series of deflectors disposed longitudinally along an axis of the digital beam. The dosage of the digital beam include those described herein.

In certain embodiments, the at least one layer comprises a thickness of two to four unit cells. For example, the at least layer can have a thickness of three unit cells. In certain embodiments, the at least one layer comprises a layer of $La^{3+}O^{2-}$. In further embodiments, the at least one layer comprises a layer of $Al^{3+}O_2^{4-}$. The at least one layer can be annealed. For example, the at least one layer can be annealed at a temperature of about 800° C. to about 900° C.

Figure 5:
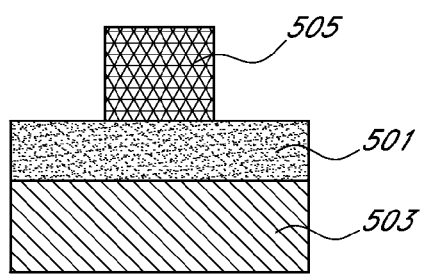
FIG. 5 is a schematic diagram of an example embodiment of a process for patterned ALD growth of $SrTiO_3$ onto a $LaAlO_3$ layer to form an array of MCOH.
Figure 6:
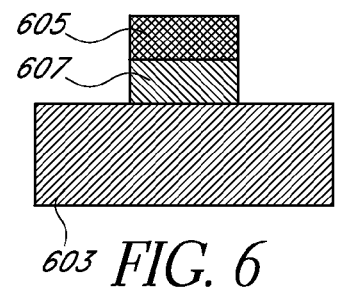
FIG. 6 is a schematic diagram of an example embodiment of a process for patterned ALD growth of $LaAlO_3$ with a first precursor including Al and a second precursor including La onto $SrTiO_3$ to form an array of MCOH.

FIG. 5 illustrates an example embodiment in which a layer of $LaAlO_3$ 501 is deposited on a bulk substrate 503. For example, a three unit cell $LaAlO_3$ layer can be deposited by ALD onto the bulk substrate. $SrTiO_3$ 505 can then be deposited onto the $LaAlO_3$ layer to form an array of multi-component oxide heterostructures. FIG. 6 illustrates a schematic diagram of an example embodiment of a process for patterned ALD growth of $LaAlO_3$ 601 with a first precursor including Al to form an $Al^{3+}O_2^{4-}$ layer 605 and a second precursor including La to form a $La^{3+}O^{2-}$ layer 607 onto $SrTiO_3$ 603 to form an array of MCOH. In some embodiments, other MCOH materials such as $LaVO_3$ can also be grown on various substrates such as $SrTiO_3$ and $LaAlO_3$ using these DBP methods.

Figure 7A:
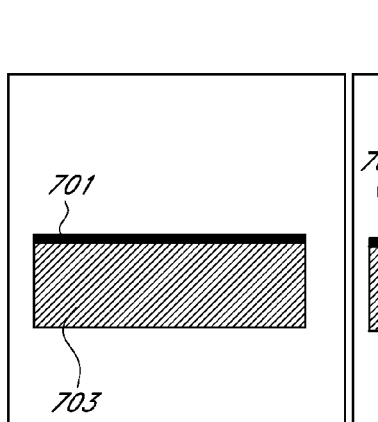
FIGS. 7A-F are schematic diagrams of an example embodiment of a process for the use of a conformal mask to assist in patterned ALD growth of $LaAlO_3$ onto $SrTiO_3$ substrate to form a lithographically delineated array of MCOH.
Figure 7B:
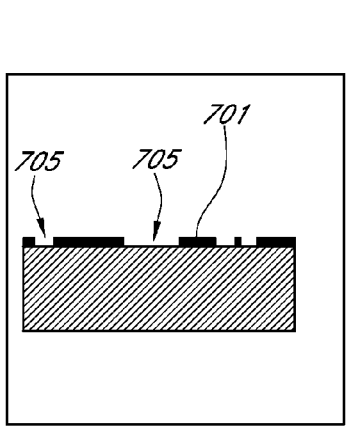

FIGS. 7A-F are schematic diagrams of an example embodiment of a process for the use of a conformal mask 701 to assist in patterned ALD growth of $LaAlO_3$ onto $SrTiO_3$ substrate to form a lithographically delineated array of MCOH. FIG. 7A illustrates an example conformal mask 701 is deposited onto a substrate 703. The conformal mask 701 is patterned and etched to expose selected areas of the underlying substrate 703, as illustrated in FIG. 7B. The substrate 703 with the conformal mask 701 is exposed to a focused ion beam to form site specific surface nucleation and to generate a suitable density of oxygen vacancies. The conformal mask may have a variety of different configurations.

In some embodiments, the conformal mask 701 includes three layers including a process mask layer, an etch mask layer, and a FIB mask layer. In some embodiments, a bare or in-process STO wafer, which may have various patterned layers or devices on its surface, is coated with a process mask layer comprised of organic material that is resistive to subsequent processes steps in the device fabrication such as wet or dry etching, metal or insulator deposition, and ion implantation. Photoresist is a good example of a suitable organic, although its light sensitive properties are not required. Next, a thinner etch mask layer is deposited that can be etched by a reactive ion etch which does not etch the organic, such as silicon or titanium. Such materials can be deposited by thermal or ebeam evaporation or sputtering. The final focused ion beam or FIB mask layer is a material which can be efficiently removed by the focused ion beam while providing high etch selectivity to the reactive etching of the etch mask layer. Such materials may include, for example, oxide or adsorbed ALD half cycle.

In further embodiments, the conformal mask includes five layers including an organic process mask layer, a plating base layer, a second organic layer, an etch mask layer and a FIB mask layer. The plating base layer is used to image reverse via electroplate and produce a metal mask in the region of FIB exposure. Additional details regarding conformal mask processing are described in U.S. Patent Publication No. 2008/0160431, incorporated herein by reference in its entirety.

The wafer is then transferred into the FIB chamber. Upon registration of alignment marks and loading of the desired pattern into the FIB, the FIB beam writes on the surface with appropriate ion type, energy and dose to remove the thin FIB mask, as shown in FIG. 7B.

This can produce a "dark field" mask in which the areas that are exposed to the FIB beam become openings 705 in the process mask layer. It is desirable to minimize the area requiring exposure in the FIB chamber to maximize tool throughput. Depending on the pattern and subsequent process step, dark field or light field patterns are needed. Having both process types can ensure that exposure does not exceed 50% of the wafer surface.

The processes for producing either dark field or light field conformal mask patterns have the advantages of a using a very thin FIB mask layer which can be optimized for minimal FIB exposure while producing an thick organic process layer that maintains critical pattern features while enabling the wide range of semiconductor processes that rely on patterned photoresist. Organic masks are preferred for their resistance to chemicals and many plasmas and can be used for patterned depositions while they can be easily removed using solvents. In the ALD embodiment, the FIB can be limited to removing adsorbed atoms as opposed to a tougher oxide, improving ion sputter yield, thereby allowing a reduction in the dose required to expose the feature. The use of an organic process mask layer beneath the focused ion beam mask ensures that ion damage does not penetrate and damage semiconductor devices below the mask. Using the focused ion beam to remove the thin surface pattern as opposed to exposing resist can provide improved fidelity needed for ever-decreasing semiconductor linewidths. Many other alternate embodiments will be apparent to those skilled in the art, and the embodiments disclosed herein are not intended to limit the scope of the disclosure.

Figure 7C:
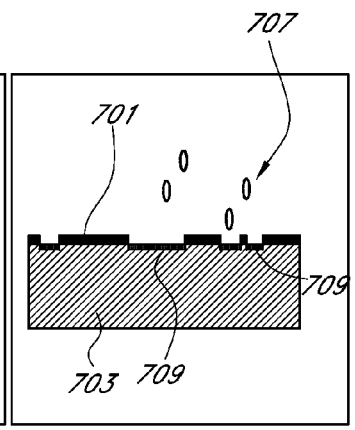
Figure 7D:
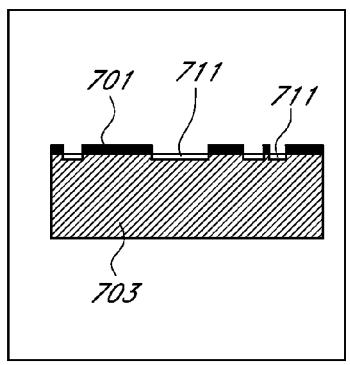
Figure 7E:
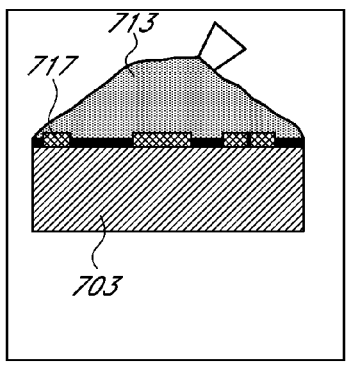
Figure 7F:
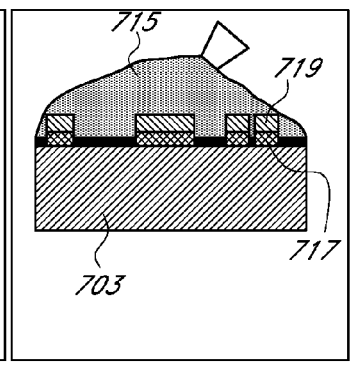

Certain embodiments disclosed herein use core DBP processes to surface nucleate and thermally activate patterned growth of $LaAlO_3$ MCOH layers with a controlled thickness of 2-4 unit cells onto a $SrTiO_{3-\delta}$ substrate. For example, FIG. 7C illustrates using a focused ion beam 707 to create nucleation sites 709, and FIG. 7D illustrates thermally activating the nucleation sites 709 to form thermally activated nucleation sites 711. Once the surface of the substrate has undergone the appropriate pre-treatment, the ultra-high density lithographically delineated arrays of MCOH layers are deposited through a sequence of pulsed lanthanum precursor gases 713, pulsed aluminum precursor gases 715, and pulsed purging gases, as illustrated in FIGS. 7E and 7D. FIG. 7E illustrates deposition of an example LaO layer 717, and FIG. 7D illustrates deposition of an example AlO layer 719.

In certain embodiments, a method of forming an array of multi-component oxide heterostructures includes depositing a conformal mask layer on a substrate comprising a $SrTiO_3$ top layer, and etching the conformal mask layer to form a conformal mask exposing selected areas of the $SrTiO_3$ top layer. The method can further include exposing the substrate to a digital beam in a first chamber. The digital bean can include a focused ion beam to introduce site specific surface nucleation and to generate a density of oxygen vacancies. The method can further include moving the exposed wafer into a second chamber to induce thermal activation of said site surface nucleation, and moving the thermally activated substrate into a third chamber. The method includes introducing a lanthanum containing source gas into the third chamber containing said thermally activated substrate, introducing a first oxygen containing source gas into the third chamber containing said thermally activated substrate, introducing an aluminum containing source gas into the third chamber containing said thermally activated substrate, and introducing a second oxygen containing source gas into the third chamber containing said thermally activated substrate. Furthermore, the method can include controlling the introducing of the lanthanum containing precursor and the introducing of the aluminum containing precursor to form by patterned atomic layer deposition a dielectric layer comprising $LaAlO_3$ having a thickness of 2 to 4 unit cells to form a well-defined multicomponent oxide heterostructure. In certain embodiments, the first oxygen source gas or the second oxygen source gas includes ozone, oxygen, and/or distilled water vapor.

For each introducing of a precursor, duration, number of times the source gas is introduced into the third chamber, and substrate temperature can be controlled. For example, a introducing period of time, a number of times the source is pulsed into the substrate, and a substrate temperature are independently controlled for each source gas to form a dielectric film containing $LaAlO_3$, the film thickness being 3 unit cells.

In certain embodiments, the method includes repeating for a number of cycles the introducing of lanthanum containing source gas, the first oxygen containing source gas, the aluminum containing source gas, and the second oxygen containing source gas. After repeating for the number of cycles, the substrate can be annealed at, for example, a temperature between about 800° C. and about 900° C.

In certain embodiments, a method for producing patterns includes using a conformal mask for focused ion beam patterning, the mask comprising subsequent dry-etch selective materials including a top FIB mask layer comprising a region removable by exposure to focused ion beams. The FIB mask layer can include, for example, an oxide or an adsorbed ALD half cycle.

In some embodiments, the mask comprises three layers including an organic process mask layer, an etch mask layer, and the FIB mask layer. In further embodiments, the etch mask layer comprises titanium and/or silicon. For example, the etch mask layer can comprise elements selected from the group consisting of titanium and silicon. Certain embodiments of the mask comprise 5 layers including an organic process mask layer, a plating base layer, a second organic layer, an etch mask layer, and the FIB mask layer, wherein the plating base layer usable to image reverse via electroplating to produce a metal mask in the region of FIB exposure. The FIB mask layer can comprise, for example, an oxide and/or adsorbed ALD half cycle.

A conformal mask can also be used in accordance with certain embodiments described with regard to FIGS. 3-6. For example, a method can include forming a conformal mask on the substrate before forming the nucleation sites. Forming a conformal mask can include depositing a mask layer on the surface of the substrate and etching portions of the mask layer to expose portions of the surface of the substrate. The mask layer can further comprises a plating base layer and a second organic layer wherein a metal mask is produced at the nucleation sites by image reverse electroplating.

Figure 8:
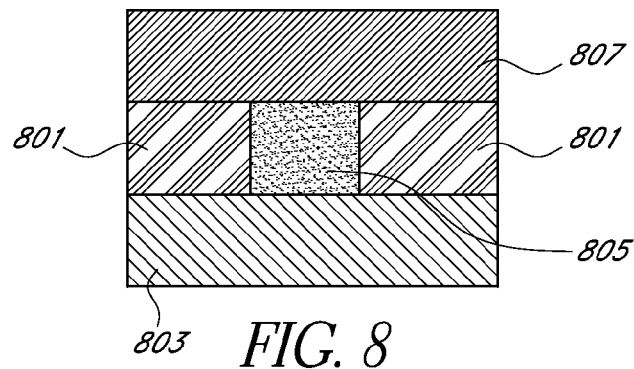
FIG. 8 is a schematic diagram of an example embodiment of a process for the use of a conformal mask to assist in patterned ALD growth of $LaAlO_3$ onto a bulk substrate with a $SrTiO_3$ layer formed on the $LaAlO_3$ to form a lithographically delineated array of MCOH.

In certain embodiments, a conformal mask pattern 801 is formed on a bulk substrate 803, as illustrated in FIG. 8. A $LaAlO_3$ layer 805 can be patterned grown on the bulk substrate 803. In some embodiments, the conformal mask 801 has substantially the same layer thickness as the $LaAlO_3$ layer 805. A $SrTiO_3$ layer 807 can then be deposited on the $LaAlO_3$ layer 805. In some embodiments, the SrTiO$_3$ layer 807 is deposited on both the LaAlO$_3$ layer 805 and the conformal mask 801.

Once the delineated array of MCOH material is deposited, some embodiments disclosed herein can further use DBP processes to provide device edit and patterning capability as well as the formation of ohmic contacts through patterned metallization. In certain embodiments, multi-component oxide layers can be formed using ALD, and DBP processes can be can be used to etch the multi-component oxide layers to form individual multi-component oxide heterostructures. For example, a plurality of multi-component oxide heterostructures can be formed by etching away a portion of the multi-component oxide layers to form islands of multi-component oxide heterostructures. In further embodiments, electrical conductors are deposited into the etched regions so that the electrical conductors are in electrical communication with a multi-component oxide heterostructure to form ohmic contacts.

Generally, in situ pattern processing by FIB can be derived from surface decomposition. FIGS. 9A-C are schematic diagrams of an example embodiment of a patterned metallization process for MCOH material to edit and trim device structures and to form electrical ohmic contacts 901. As an example, for deposition, a molecular interaction between a metal organic precursor gas 913 with the decomposed molecules 911 at the surface of the substrate can provide the element of deposition to form an ohmic contact 915. Incident ions may lose their energy by collisions with nuclei at the target surface. If the molecular energy of a surface molecule is above dissociation energy of adsorbate, adsorbed molecules can break, leading to decomposition. Surface molecular energy may be further enhanced by the collision cascades of lattice atoms. Surface atoms that attain energy in excess of the adsorbate will decompose an adsorbed molecule, provided the adsorbate is not depleted within the immediate exposure area. If the area of decomposition is a patterned exposure feature, the deposition may accumulate around the pattern, creating an in situ processed feature. Increasing the thermal energy of the surface molecules to a temperature high enough to dissociate the adsorbate, but below the gas spontaneous decomposition temperature, can assist the surface dissociation energy, and can enhance the adsorbed molecules and thus, the decomposition rate. Depleting the precursor gas at the location of beam exposure can reduce the decomposition cycle and thus can reduce the deposition rate. This factor is compounded by higher beam current, which causes sputter etching instead of deposition. These three factors of thermal activation, precursor refresh and beam current may be adjusted to realize a higher throughput patterned process. A higher throughput deposition process with low contamination can be realized with a high speed, automated tool that can expose low doses of spatially resolved ion packets at high speed. Digital Beam Processing (DBP) is a unique technique that takes these factors into consideration with the emphasis of high resolution patterning.

As illustrated in FIGS. 9B-C, ions of selected energy, species, and dose are provided with significant latitude to initiate the dissociation energy exchange process at the surface of the substrate (e.g., wafer) 901. The digital flashes 911 are spatially and temporally resolved into pixel sites over at least some of the surface or the entire surface of the substrate 901 at high speed and high resolution. After completion, the substrate 901 is then moved to a second chamber while still under vacuum for thermal activation and exposure to a desired precursor gas. Once adsorbate decomposition occurs across the entire wafer, the process is then complete. Additional steps may improve the pattern feature resolution (e.g., critical dimension (CD), line edge roughness (LER)), decomposition profile, or precursor/catalyst contamination yield, a highly efficient and effective process flow is outlined. Once the wafer is quenched to a stable lithographic temperature, it is placed back into the beam exposure chamber for global and local pattern overlay alignment by the system. At the desired resolution, the wafer and associated surface pattern is spatially stable, allowing the mapping software to re-create fixed distortions within the pattern file (e.g., software file) and map the next exposure layer onto the wafer. This process flow allows maximum refresh time greater than 0.001 seconds, thermal process activation, and next level correction of pattern distortions induced by the process flow. Deposition process examples include: particle beam and thermal activated deposition, chemical vapor assisted deposition, particle beam activated thermal nucleation deposition, particle beam activated atomic layer deposition, and chemically assisted particle beam deposition.

Multiple activation by exposure to a digital beam and a process gas can dramatically improve the efficiency of deposition, etch (an example embodiment of etching is illustrated in FIG. 9A), and implant processes. A digital beam specifically designed for a particular process in terms of energy, species, and current, which is possible because the digital beam parameters are adjustable, can impact and decompose a portion of the process gas molecules. The decomposed molecules strike surface atoms of the workpiece to sputter or implant new atoms into the workpiece, or to deposit new atoms on the workpiece surface. In some embodiments, portions and/or all of the workpiece is heated during exposure.

The deposition of thin films has been a staple process in microelectronics fabrication. Many techniques have been used to deposit thin films, including evaporation, physical vapor deposition (PVD) (e.g., sputter deposition), chemical vapor deposition (CVD), atomic later deposition (ALD), plating (e.g., electroplating), and coating (e.g., spin coating). In conventional fabrication, these techniques normally deposit material on an entire surface of a workpiece, and the material is formed into patterns by a liftoff or milling process using a resist patterning process. Due to the cost, complexity, and physical limitations of resist patterning processes, other non-resist techniques are generally preferred in semiconductor processing. Deposition techniques that may advantageously avoid resist patterning processes by exposure to a particle beam before, during, or after the application of a deposition process include particle beam and thermally activated deposition, for example, but not limited to, digital beam activated CVD, digital beam activated thermal nucleation, digital beam activated ALD, and chemically-assisted digital beam deposition.

Two examples of direct pattern deposition which can be used for patterned ALD growth of MCOH are ion beam nucleation deposition (IBND) and chemically assisted ion beam deposition (CAIBD). Both techniques decompose or nucleate atoms on the surface of a workpiece, but can be limited by slow beam writing techniques. CAIBD is described above with respect to advantages in using a digital beam, although it may be performed without a digital beam. IBND is a multi-PVD/CVD process in which an organic gas is introduced to a workpiece after it has been exposed by a particle beam. Growth occurs from the nucleation (exposed) sites similar to ALD. IBND generally employs an ion dosage that is about five orders of magnitude less than CAIBD, which enables IBND to be more than 100,000 times faster than CAIBD.

Figure 10:
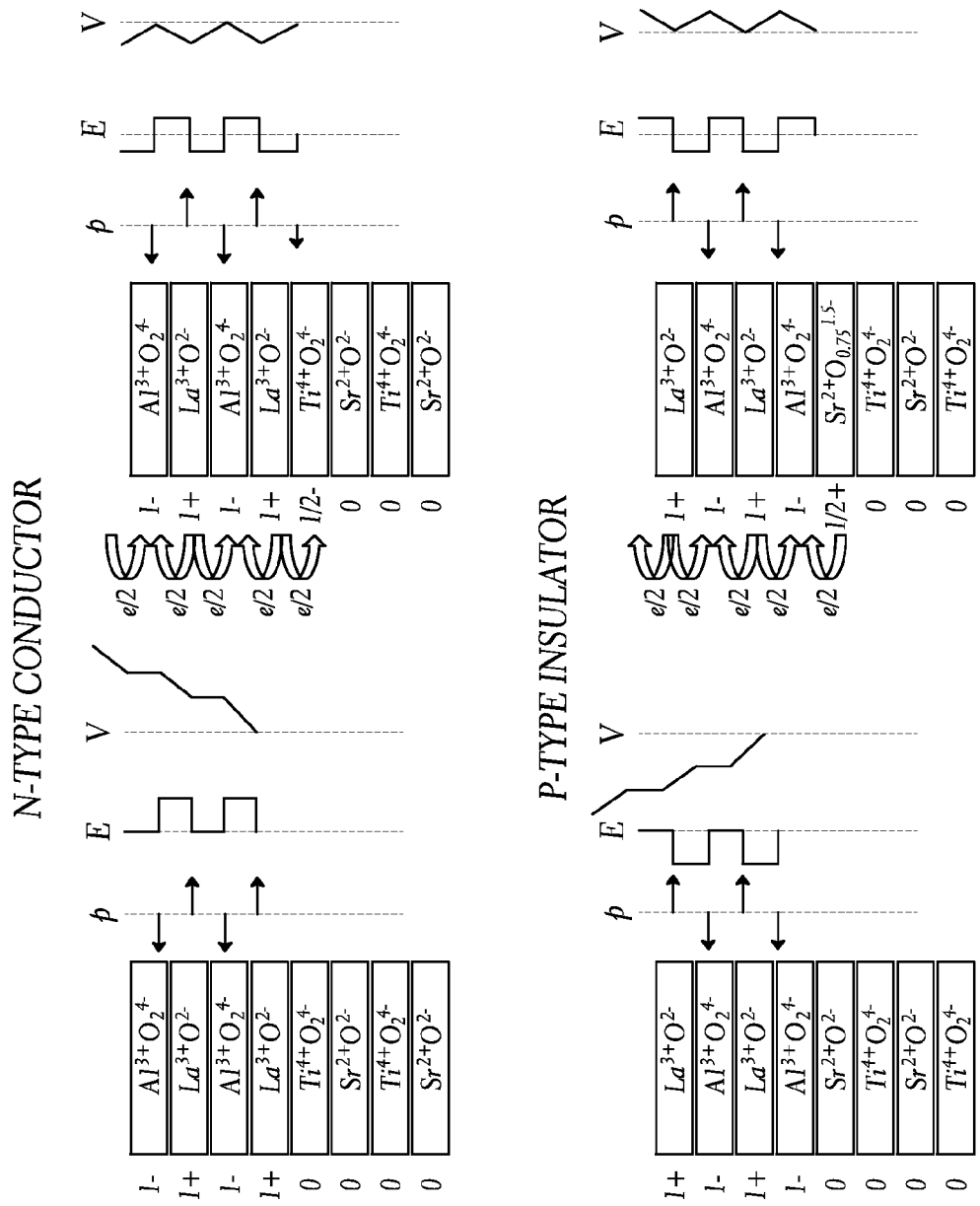
FIG. 10 is a schematic diagram of an example embodiment of two possible material interfaces that can form during growth of LaAlO$_3$ onto SrTiO$_3$ in the (001) orientation using DBP methods.

In certain embodiments, for fabrication of LAO/STO devices using DBP technology two possible material interfaces can result between $LaAlO_3$ and $SrTiO_3$ in the (001) orientation, as shown in FIG. 10. According to one embodiment for avoiding polar catastrophe the structure is an n-type conductor with an interface placed at the $AlO_2/LaO/TiO_2$ plane wherein a half an electron is added to the last Ti layer and a half an electron is removed from the uppermost $AlO_2$ layer with appropriate surface reconstruction. According to another embodiment, the LAO/STO MCOH material is a p-type insulator with an interface placed at the $AlO_2/SrO/TiO_2$ plane and where half an electron is removed from the SrO plane in the form of oxygen vacancies.

Figure 11:
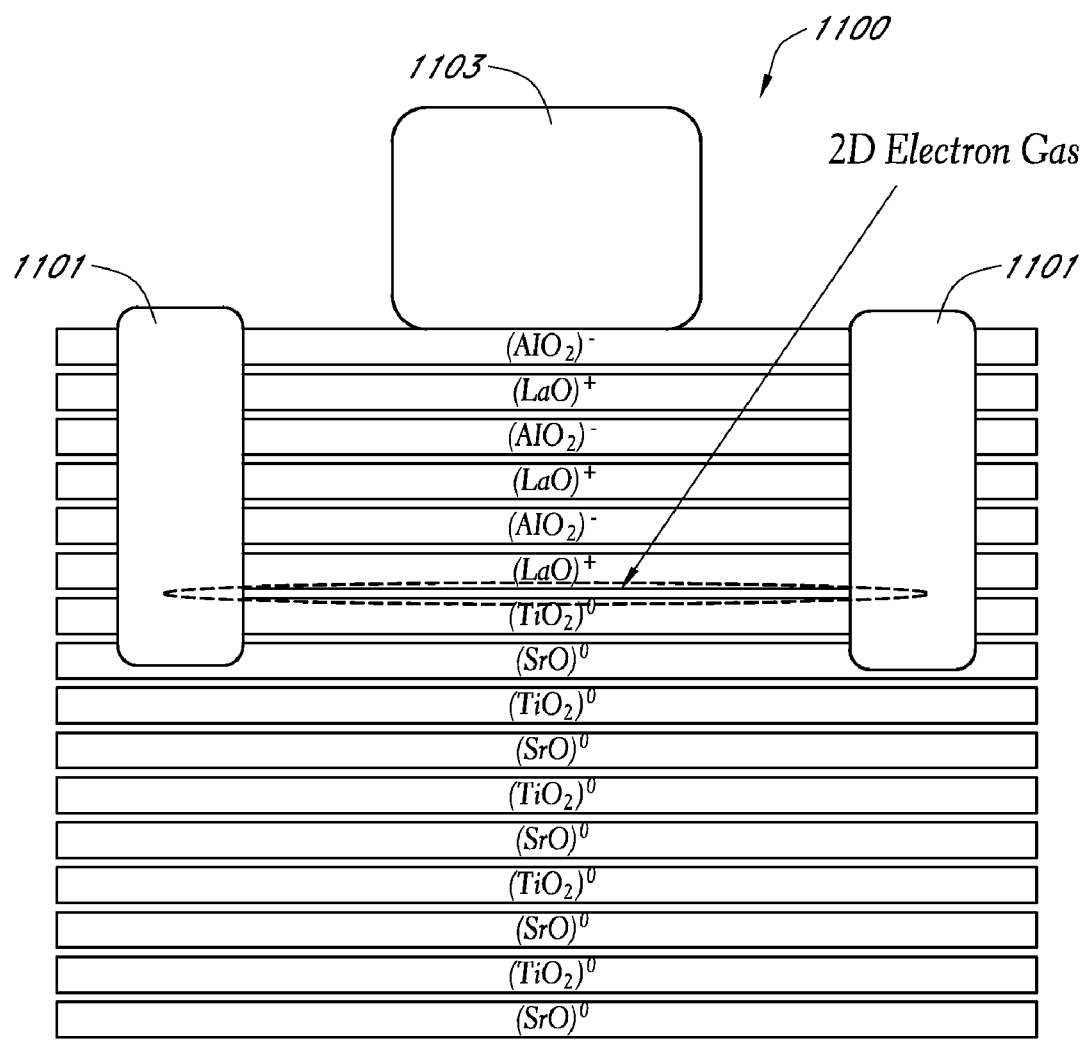
FIG. 11 is a schematic diagram of an example embodiment of an MCOH memory device fabricated using DBP.

As illustrated in FIG. 11, an example embodiment of an MCOH device 1100 that can use DBP to grow n-type $LaAlO_3/SrTiO_3$ MCOH material and fabricate an ultra high density of oxide memory devices. Patterned metallization can be used to form ohmic contacts 1101 such as gold, aluminum, copper, etc., and a refractory metal gate 1103 such as tungsten, molybdenum, niobium, tantalum, etc. For example, ohmic contacts and refractory gates can be created using techniques as those described above.

Figure 12:
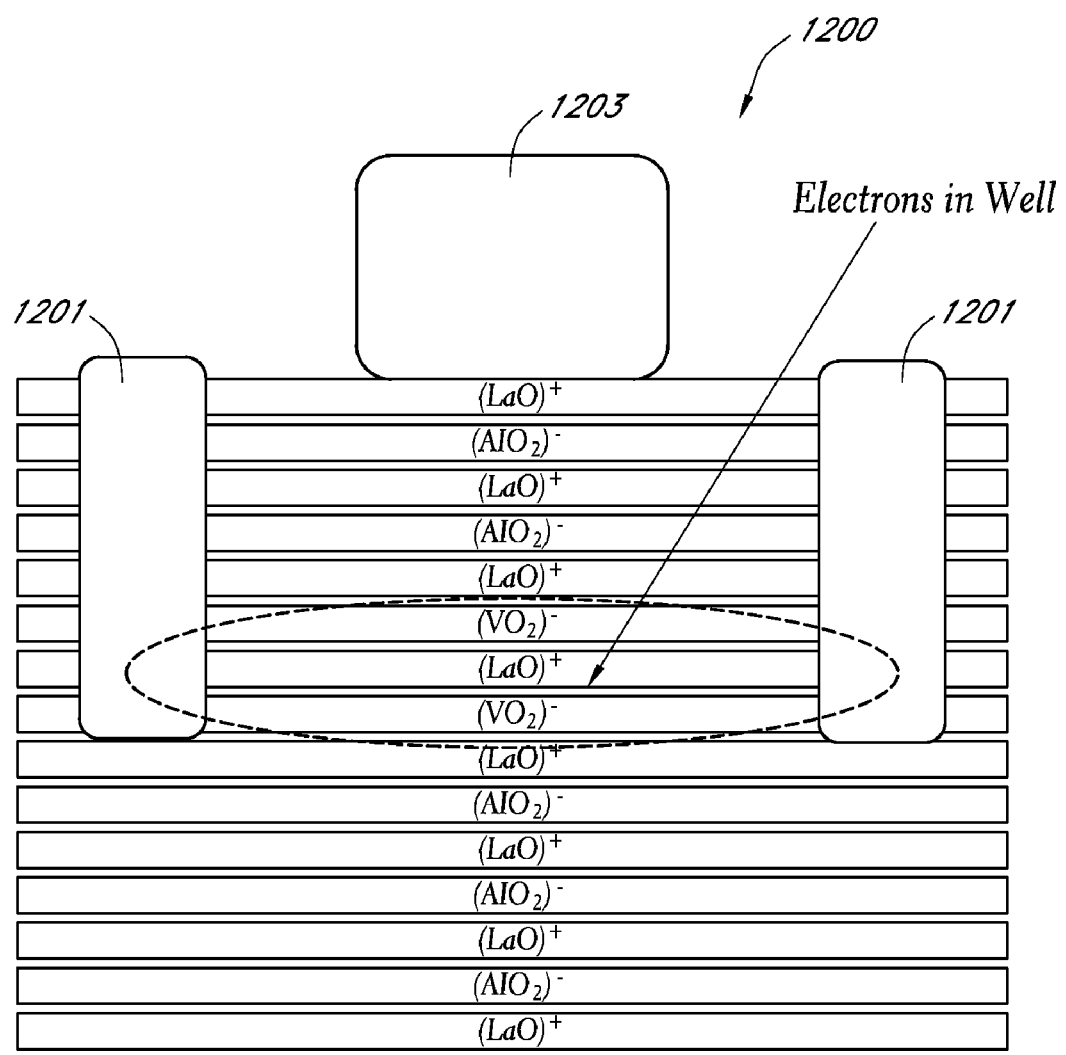
FIG. 12 is a schematic diagram of an example embodiment of an MCOH NMOS device fabricated using DBP.

In another embodiment of an MCOH device 1200, as shown in FIG. 12, DBP can be used to fabricate a delineated array of correlated oxide NMOS devices (e.g., electron doping) including, but not limited to, patterned DBP growth of $LaAlO_3/LaVO_3/LaAlO_3$ quantum wells, with thicknesses ranging from 5 to 20 unit cells, patterned metallization to form nanoscale ohmic contacts 1201, a refractory metal gate 1203, and a thin $LaAlO_3$ capping layer, with a thickness ranging from 2.5 to 4.5 unit cells.

Figure 13:
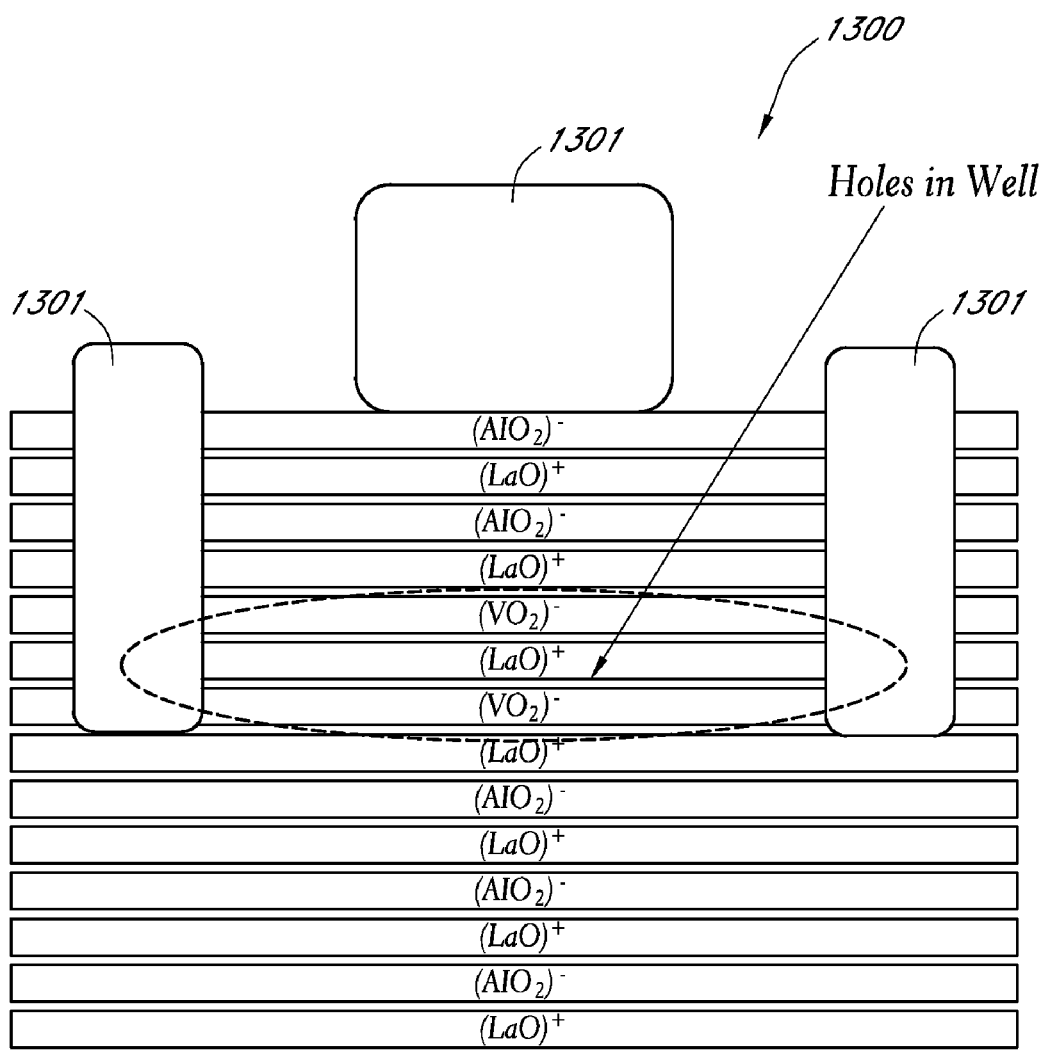
FIG. 13 is a schematic diagram of an example embodiment of an MCOH PMOS device fabricated using DBP.

As illustrated in FIG. 13, another example of an embodiment of an MCOH device 1300 is an array of delineated p-type (hole doping) $LaAlO_3/LaVO_3/LaAlO_3$ quantum wells, with thicknesses ranging from 5 to 20 unit cells, produced by DBP methods, wherein the thickness of the $LaAlO_3$ capping layer is reduced by a half unit cell to make correlated oxide PMOS devices. The DBP techniques include, but are not limited to, patterned metallization to form nanascale ohmic contacts 1301, a refractory metal gate 1303, and a thin $LaAlO_3$ capping layer, with a thickness ranging from 2 to 4 unit cells.

Figure 14:
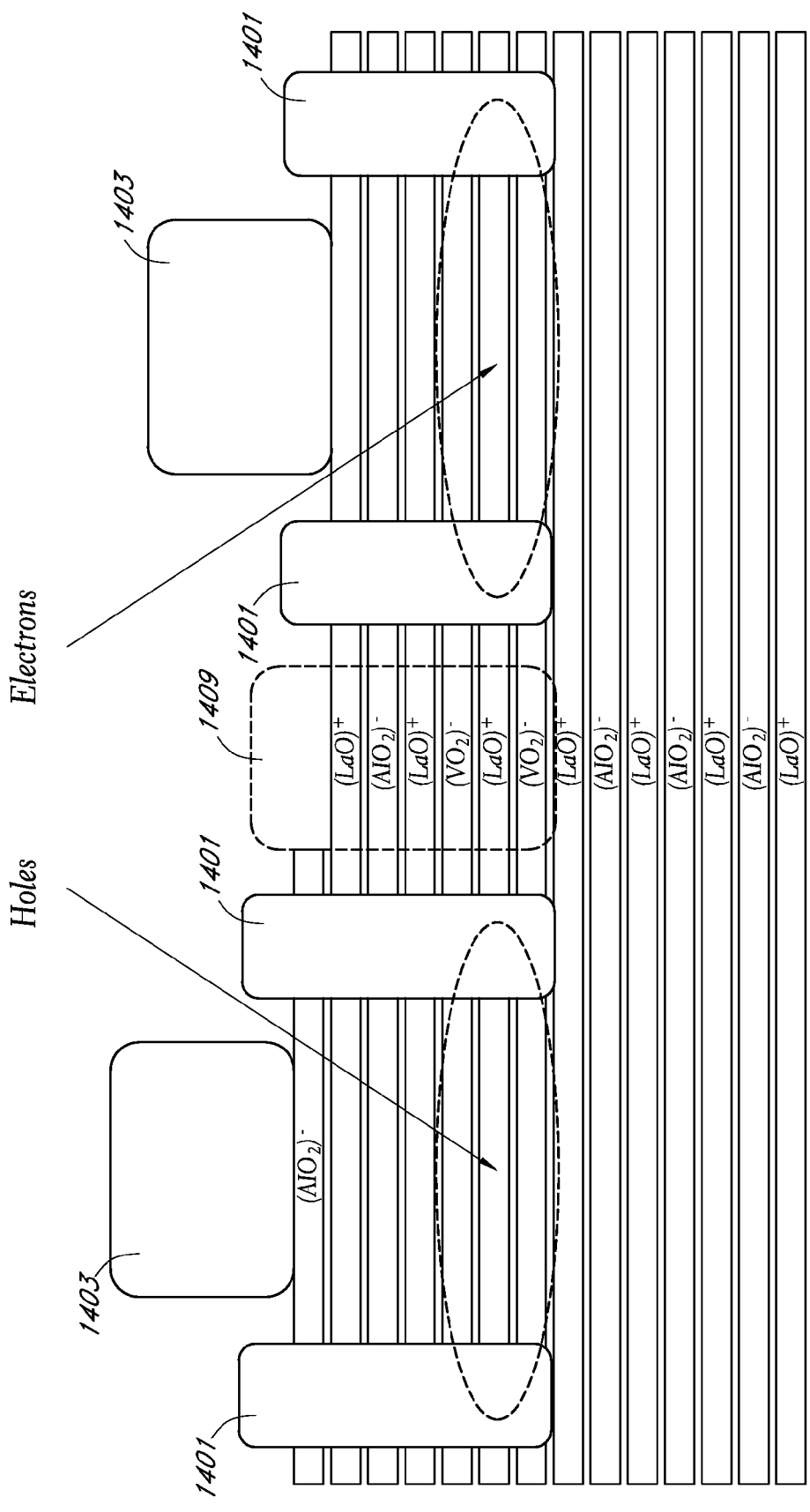
FIG. 14 is a schematic diagram of an example embodiment of an MCOH CMOS device fabricated using DBP methods including, but not limited to, patterned etch, implant, and deposition.

In still another embodiment, an MCOH device 1400 is shown in FIG. 14 where correlated oxide PMOS devices 1405 and NMOS devices 1407 devices are fabricated on the same substrate and functionally combined together to form a CMOS device while the electrically active regions are suitably electrically isolated from each other. Ohmic contacts 1401 and a refractory metal gate 1403 can be patterned metalized as described above.

The electrically isolating region 1409 that electrically isolates individual PMOS devices 1405 and NMOS devices 1407 can be formed using various techniques. In one embodiment, the electrically isolating region 1409 can be created by implanting ions (e.g., arsenic) to create electrical insulation. In another embodiment, oxygen atoms in the electrically isolating region 1409 can be removed (e.g., knocked out) which creates oxygen vacancies. The oxygen vacancies can create an electrical insulator. In a further embodiment, the electrically isolating region 1409 can be formed by etching between the PMOS device 1405 and the NMOS device 1407 to form a groove (e.g., hole, pit, void) between the PMOS device 1405 and the NMOS device 1407. The groove can be filled with an electrical insulator (e.g., oxide) or can be unfilled. Furthermore, a conformal mask can also be used to block other regions of the MCOH device 1400 during the formation of the electrically isolating region 1409. In certain embodiment, the electrically isolating region 1409 includes one or more electrical barriers. For example, the electrically isolating region 1409 can have double or triple barriers. Furthermore, the electrically isolating region can completely surround individual PMOS devices 1405 and NMOS devices 1407. For example, the electrically isolating region can be an annular shape around the PMOS device 1405 or NMOS device 1407.

The MCOH devices described above can have dimensions (e.g., length and width) that are sub-micron. In certain embodiments, the length of the MCOH device (e.g., distance between the ohmic contacts) is between about 130 nm and about 1 nm. Similarly, in certain embodiments, the width of the MCOH device (e.g., depth of the MCOH device) is between about 130 nm and about 1 nm.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method of forming an array of multi-component oxide heterostructures, the method comprising:
   exposing a substrate comprising a $SrTiO_3$ top layer to a digital beam in a first chamber, the first chamber comprising a focused ion beam to introduce site specific surface nucleation and to generate a density of oxygen vacancies;
   moving the exposed substrate into a second chamber to induce thermal activation of said substrate;
   moving the thermally activated substrate into a third chamber;
   introducing a lanthanum containing precursor into the third chamber;
   introducing an aluminum containing precursor into the third chamber; and
   controlling the introducing of the lanthanum containing precursor and the introducing of the aluminum containing precursor to form by patterned atomic layer deposition a dielectric layer comprising $LaAlO_3$ having a thickness of 2 to 4 unit cells to form a well-defined high density array of multi-component oxide heterostructures.

2. The method of claim 1, wherein, after introducing the lanthanum containing precursor into the third chamber, introducing a first oxygen containing precursor into the third chamber.

3. The method of claim 2, wherein, after introducing the aluminum containing precursor into the third chamber, introducing a second oxygen containing precursor into the third chamber.

4. The method of claim 1, further comprising repeating for a number of cycles the introducing of the lanthanum containing precursor and the aluminum containing precursor to achieve a thickness.

5. A method of forming a multi-component oxide heterostructure, the method comprising:
   forming nucleation sites on a $SrTiO_3$ surface of a substrate with a focused ion beam by chemically modifying portions of the surface of the substrate;
   depositing at least one layer of $LaAlO_3$ at the nucleation sites.

6. The method of claim 5, wherein the depositing at least one layer comprises atomic layer deposition.

7. The method of claim 5, further comprising thermally activating the substrate after forming the nucleation sites.

8. The method of claim 5, wherein the depositing the at least one layer comprises reacting a gas with the nucleation sites.

9. The method of claim 5, wherein the focused ion beam is a digital beam.

10. The method of claim 9, wherein the digital beam comprises:
    forming a stream of particles;
    collimating the stream of particles along an axis of propagation to form the focused ion beam; and
    digitizing the focused ion beam.

11. The method of claim 9, wherein the digitizing the focused ion beam comprises creating temporally and spatially resolved digital flashes comprising at least one particle per digital flash.

12. The method of claim 9, further comprising deflecting the digital beam with a series of deflectors disposed longitudinally along an axis of the digital beam.

13. The method of claim 5, further comprising forming a conformal mask on the substrate before forming the nucleation sites.

14. The method of claim 13, wherein the forming a conformal mask comprises:
    depositing a mask layer on the surface of the substrate;
    etching portions of the mask layer to expose portions of the surface of the substrate.

15. The method of claim 5, wherein the at least one layer comprises a thickness of two to four unit cells.

16. The method of claim 15, wherein the at least layer has a thickness of three unit cells.

17. The method of claim 15, wherein the at least one layer comprises a layer of $La^{3+}O^{2-}$.

18. The method of claim 17, wherein the at least one layer comprises a layer of $Al^{3+}O_2^{4-}$.

19. A method of forming an array of multi-component oxide heterostructures, the method comprising:
    exposing a substrate comprising a $LaAlO_3$ top layer to a digital beam in a first chamber comprising a focused ion beam to introduce site specific surface nucleation;
    moving the exposed substrate into a second chamber to induce thermal activation of said substrate;
    moving the thermally activated substrate into a third chamber;
    introducing a lanthanum containing precursor into the third chamber;
    introducing a vanadium containing precursor into the third chamber;
    introducing a second lanthanum precursor into the third chamber;
    introducing an aluminum precursor into the third chamber;
    controlling the introducing of the lanthanum containing precursor and the introducing of the vanadium containing precursor to form by patterned atomic layer deposition a dielectric layer comprising $LaVO_3$ having a dielectric layer thickness of 5 to 20 unit cells to form a well-defined high density array of multi-component oxide heterostructures; and
    controlling the introducing of the second lanthanum containing precursor and the introducing of the aluminum containing precursor to form by patterned atomic layer deposition a thin dielectric capping layer comprising $LaAlO_3$ having a capping layer thickness of 2 to 4.5 unit cells.

20. The method of claim 19, further comprising repeating for a number of cycles the introducing of the lanthanum containing precursor and the vanadium containing precursor to achieve the dielectric layer thickness; and further comprising repeating for a number of cycles the introducing of the second lanthanum containing precursor and the aluminum containing precursor to achieve the capping layer thickness.

21. The method of claim 19, wherein the dielectric layer forms quantum wells.

22. The method of claim 21, wherein, the capping layer dopes electrons into the $LaVO_3$ quantum wells.

23. The method of claim 21, wherein, the capping layer dopes holes into the $LaVO_3$ quantum wells.

24. The method of claim 19, wherein, at least one of the multi-component oxide heterostructures is n-type and the capping layer thickness is between 2.5 and 4.5 unit cells.

25. The method of claim 19, wherein, at least one of the multi-component oxide heterostructures is p-type and the capping layer thickness is between 2 and 4 unit cells.

26. The method of claim 19, wherein, at least one of the multi-component oxide heterostructures is a NMOS device comprising a n-type MCOH material.

27. The method of claim 19, wherein, at least one of the multi-component oxide heterostructures is a PMOS device comprising a p-type MCOH material.

28. The method of claim 19, further comprising pattern etching the capping layer and the dielectric layer with a digital beam to form sites for ohmic contacts; exposing the sites for ohmic contacts to a digital beam to introduce ohmic contact surface nucleation sites; and depositing an electrical conductor onto the ohmic contact surface nucleation sites.

29. The method of claim 19, wherein, both p-type and n-type MCOH materials are grown side-by-side on the same substrate by patterned nucleation and then fabricated into MCOH CMOS devices by patterned metallization, etch, and implant to form ohmic contacts, interconnects, refractory metal gate lines, and electrical isolation barriers.

30. The method of claim 19, further comprising forming a PMOS device comprising at least one of the multi-component oxide heterostructures; forming a NMOS device comprising at least one of the multi-component oxide heterostructures, wherein the PMOS device neighbors the NMOS device and the PMOS device is electrically isolated from the NMOS device by at least one electrical isolation barrier.

31. The method of claim 30, wherein forming the NMOS device and forming the PMOS device comprise pattern etching the capping layer and the dielectric layer with a digital beam to form sites for ohmic contacts; exposing the sites for ohmic contacts to a digital beam to introduce ohmic contact surface nucleation sites; and depositing an electrical conductor onto the ohmic contact surface nucleation sites.

* * * * *